United States Patent
Kato

(10) Patent No.: US 8,884,246 B2
(45) Date of Patent: Nov. 11, 2014

(54) CHARGED PARTICLE OPTICAL SYSTEM AND SCRIBING APPARATUS

(71) Applicant: Canon Kabushiki Kaisha, Tokyo (JP)

(72) Inventor: Takahisa Kato, Brookline, MA (US)

(73) Assignee: Canon Kabushiki Kaisha, Tokyo (JP)

( * ) Notice: Subject to any disclaimer, the term of this patent is extended or adjusted under 35 U.S.C. 154(b) by 17 days.

(21) Appl. No.: 13/667,337

(22) Filed: Nov. 2, 2012

(65) Prior Publication Data

US 2013/0112891 A1    May 9, 2013

(30) Foreign Application Priority Data

Nov. 9, 2011    (JP) .................. 2011-245004

(51) Int. Cl.
*H01J 37/147*   (2006.01)
*H01J 29/74*    (2006.01)
*H01J 37/317*   (2006.01)
*H01J 37/04*    (2006.01)

(52) U.S. Cl.
CPC ........... *H01J 37/045* (2013.01); *H01J 37/3177* (2013.01); *H01J 2237/151* (2013.01); *H01J 2237/0435* (2013.01); *H01J 2237/03* (2013.01)
USPC ...................... 250/398; 250/396 R

(58) Field of Classification Search
CPC .............. H01J 1/00; H01J 1/46; H01J 1/48; H01J 1/88; H01J 1/90; H01J 1/92; H01J 1/94; H01J 1/96; H01J 1/99; H01J 29/46; H01J 29/82; H01J 29/823; H01J 29/826; H01J 37/02; H01J 37/04; H01J 37/10; H01J 37/12

USPC .............................. 250/396 R–400
See application file for complete search history.

(56) References Cited

U.S. PATENT DOCUMENTS

| | | | |
|---|---|---|---|
| 6,327,087 B1 | 12/2001 | Hashimoto et al. | |
| 6,900,925 B2 | 5/2005 | Kato et al. | |
| 7,038,834 B2 | 5/2006 | Kato et al. | |
| 7,045,794 B1 * | 5/2006 | Spallas et al. | 250/396 R |
| 7,220,009 B2 | 5/2007 | Shimada et al. | |
| 7,310,176 B2 | 12/2007 | Kato et al. | |
| 7,355,774 B2 | 4/2008 | Kato et al. | |
| 7,423,795 B2 | 9/2008 | Kato et al. | |
| 7,446,920 B2 | 11/2008 | Kato et al. | |
| 7,518,774 B2 | 4/2009 | Kato et al. | |
| 7,643,197 B2 | 1/2010 | Kato et al. | |
| 7,656,570 B2 | 2/2010 | Torashima et al. | |

(Continued)

FOREIGN PATENT DOCUMENTS

| | | |
|---|---|---|
| JP | 9-007538 | 1/1997 |
| JP | 2005-123264 | 5/2005 |
| WO | 2010/125526 | 11/2010 |

*Primary Examiner* — Nicole Ippolito
*Assistant Examiner* — David E Smith
(74) *Attorney, Agent, or Firm* — Fitzpatrick, Cella, Harper & Scinto

(57) ABSTRACT

An optical system for a charged particle includes a first member though which a charged particle beam is transmitted and a second member to control optically the charged particle beam transmitted through the first member. The second member has a fixing portion fixed to the first member. A slit is arranged between a part of the second member and the fixing portion to separate the part of the second member from the fixing portion, such that the part of the second member is a cantilever beam structure pivotal in relation to the fixing portion.

12 Claims, 10 Drawing Sheets

(56) References Cited

U.S. PATENT DOCUMENTS

| | | |
|---|---|---|
| 7,714,298 B2 * | 5/2010 | Platzgummer ............ 250/396 R |
| 7,855,820 B2 | 12/2010 | Kato et al. |
| 8,254,004 B2 | 8/2012 | Ushijima et al. |
| 2002/0005491 A1 * | 1/2002 | Yagi et al. ............... 250/396 ML |
| 2004/0231150 A1 * | 11/2004 | Charles et al. .................. 29/825 |
| 2007/0125954 A1 * | 6/2007 | Frosien .................... 250/396 R |
| 2010/0276606 A1 * | 11/2010 | Baars et al. ............... 250/396 R |
| 2011/0084220 A1 * | 4/2011 | Koning et al. ............. 250/492.3 |
| 2011/0116145 A1 | 5/2011 | Fujii et al. |
| 2012/0170889 A1 | 7/2012 | Kato |

* cited by examiner

CHARGED PARTICLE OPTICAL SYSTEM AND SCRIBING APPARATUS

BACKGROUND OF THE INVENTION

1. Field of the Invention

The present invention relates to a charged particle optical system which is used in an apparatus that uses a charged particle ray therein such as an electron beam, and a scribing apparatus using the same.

2. Description of the Related Art

An opt-electronic element for controlling the optical properties of an electron beam is used in an electron beam exposure apparatus. In the opt-electronic element, a deflector is an element which deflects an electron beam so as to make the electron beam scan a desired region and scribe an image on the region. WO 2010/125526 discloses an electrostatic deflector which simultaneously deflects a plurality of electron beams with an electric field. The deflector has a slim comb tooth structure in which two electrodes dovetail with each other while being separated by a gap, and deflects a beam row with an electric field which has been generated in the gap of the comb tooth structure.

In an electrostatic deflector which deflects the electron beam with the electric field, generally, deflection sensitivity changes according to a manufacture error of a gap between the electrodes, in which the electric field is generated. A change of the deflection sensitivity may reduce the uniformity of a scanning amplitude of the electron beam and the parallelism of the electron beam at the time of parallel scanning in combination with a lens. Particularly, when a plurality of electron beams is simultaneously deflected, if there is distribution (ununiformity) in the gaps between electrodes in the deflector, it becomes less easy to correct an individual deflection amount of the plurality of the electron beams. Accordingly, in order to uniformize the deflection amounts of the electron beams, it is important to reduce the distribution of the gaps between electrodes.

SUMMARY OF THE INVENTION

According to an aspect of the present invention, an optical system of charged particle comprises: a first member though which a charged particle beam is transmitted; and a second member configured to control optically the charged particle beam transmitted through the first member, wherein the second member is fixed through a fixing portion to the first member, and the fixing portion is placed on a part of the second member to interfere with a transmission of a deforming stress from the first member to the second member.

The optical system according to the present invention can reduce the distribution of the gaps between electrodes in the deflector, a change of a gap between elements for which an optical system is used, and the like. In apparatuses such as a charged particle scribing apparatus, it generally contributes to the enhancement of the space efficiency, assembling accuracy and alignment accuracy of the optical system to assemble a plurality of elements to be integrated or shorten the arrangement distance, and imparts higher performance to the apparatus due to the reduction of deflection error and the like. However, on the other hand, the method occasionally causes a problem that deforming stress due to generated heat in a member such as a stop aperture array which receives charged particles, is transmitted to an adjacent member and ununiformly deforms the member. According to the present invention, the above described problem is solved and an improved balance between the minimized configuration and the maintenance of the high performance is accomplished.

Further features of the present invention will become apparent from the following description of exemplary embodiments with reference to the attached drawings.

DESCRIPTION OF THE EMBODIMENTS

Figure 1A:
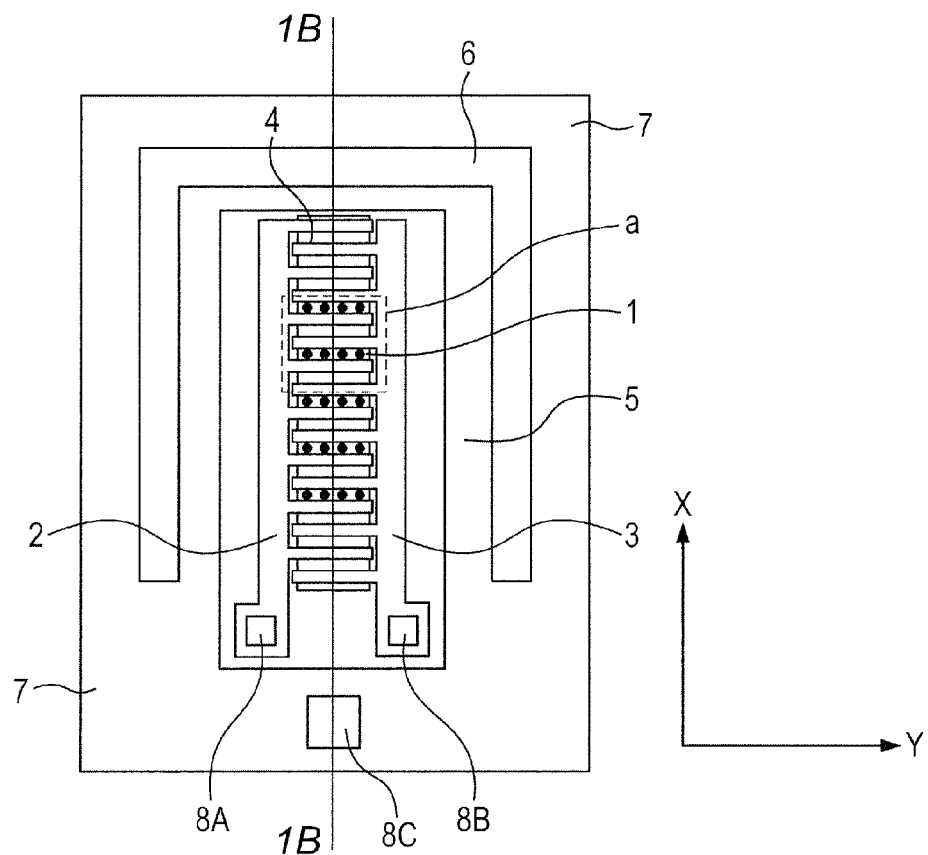
FIGS. 1A and 1B are schematic views illustrating an electrostatic deflector according to Example 1 of the present invention.

Preferred embodiments of the present invention will now be described in detail in accordance with the accompanying drawings.

The present invention has such features in a charged particle optical system that a second member is placed on a fixing portion to interfere with a transmission of a deforming stress from a first member to the second member. Techniques of placing the second member on the fixing portion include, for instance: a technique of providing a stress suppressing structure between the second member and the fixing portion to interfere with the transmission of the above described deforming stress; and a technique of fixing the second member by the fixing portion so that the second member forms a cantilever beam structure pivotal in relation to the first member. The first member includes a stop aperture array which selectively passes a charged particle beam (also referred to as charged particle ray) therethrough or shields the charged particle beam, and a beam forming member. The second member includes: a stop aperture array and an electrostatic lens for optically controlling the charged particle beam which has passed through the first member; and an electrostatic deflector for deflecting the charged particle beam. As for the combination, when the first member is the stop aperture array, the second member can be another stop aperture array, the electrostatic lens or the electrostatic deflector. In addition, when the first member is the beam forming member (see aperture array 109 which will be described later), the second member can be one of the electrostatic lens and the electrostatic deflector. In the following, the combination of the stop aperture array and the electrostatic deflector is mainly described, but techniques of placing the second member on the fixing portion are basically the same. When the second member is, for instance, an electrostatic lens which has a plurality of electrodes each having at least one through hole therein, and has an insulating spacer that is provided between the electrodes to define a gap between the electrodes, one electrode of the electrostatic lens is placed on the fixing portion to interfere with the transmission of the deforming stress from the first member to the one electrode of the electrostatic lens through the fixing portion.

One embodiment of a charged particle optical system of the present invention includes: a light source for generating a plurality of charged particle beams; and an electrostatic deflector which is a second member and deflects the plurality of the charged particle beams. In addition, the optical system of the present embodiment includes the stop aperture array which is a first member and has a possibility of generating heat while being used and causing deformation, wherein the first member and the electrostatic deflector are fixed to constitute a unit. The electrostatic deflector has an electrode supporting portion which is fixed to the stop aperture array through the fixing portion. The first electrode and the second electrode are arranged on the electrode supporting portion. The first and the second electrodes have a gap in which an electric field is generated for deflecting the plurality of the charged particle beams. The charged particle beams passing through the gap are deflected according to the generated electric field by generating a potential difference between the first electrode and the second electrode. The electrostatic deflector of the present embodiment has a stress suppressing structure which, for instance, prevents a deforming stress having occurred in a predetermined direction from being transmitted to the electrode supporting portion through the fixing portion, even when the stop aperture array which constitutes the unit has caused deformation therein. This stress suppressing structure interferes with the transmission of the stress corresponding to deformation toward a direction of the deflecting electric field, and can reduce the occurrence of the distribution of the gaps between the first electrode and the second electrode. When the distribution of the gaps is reduced, the distribution of the strengths of the deflecting electric fields is reduced, and accordingly a deflection dispersion of the plurality of the charged particle beams can be reduced. If a large number of charged particle beams are arrayed so as to be close to each other, in particular, it becomes difficult to individually correct a deflection amount. For this reason, it is desirable to reduce the dispersion of the deflection amounts in this way. In addition, the optical system has the stress suppressing structure to be able to reduce the dispersion of the deflection amounts even when the unit includes such a member as to cause a large deformation. Thereby, the flexibility of the arrangement in the optical system can be increased.

In addition, the charged particle optical system has a plurality (for instance, two) of electrostatic deflectors which generate electric fields that deflect the beams in the same direction, and can be configured to have each deflector arranged therein so that the charged particle beams sequentially pass there-through. The optical system enables a deflection of arbitrarily changing both a translation amount and an angle of the charged particle beams, by using the two electrostatic deflectors. Furthermore, such a deflection can also be achieved that only the angle is changed with respect to certain arbitrary one point of the deflection center. At this time, the fixing portions to be fixed to the unit in the respective electrostatic deflectors are arranged in the same side in a direction of the deflecting electric field when viewed from regions of first and second electrodes. If the fixing portions of the two electrostatic deflectors are arranged in the same side in this way, a difference of temperature distribution and heat deformation in the electrode supporting portion between the two electrostatic deflectors can be reduced. Because of this, the distributions of the gaps between the electrodes also show the same tendency, and accordingly a ratio of the deflection amount in each deflector for the charged particle beams can be kept almost constant. Accordingly, when the charged particle beams are deflected so that only the angle is changed with respect to the certain arbitrary one point of the deflection center as described above, the positions offset in the deflection center can be suppressed.

In addition, the charged particle optical system can have a slit which separates the fixing portion and the electrode supporting portion from each other arranged therein as the stress suppressing structure which the electrostatic deflector has. This slit is provided so as to interfere with a transmission of a stress in a direction of the deflecting electric field, toward the electrode supporting portion of the electrostatic deflector. The electrode supporting portion becomes a cantilever beam structure which has one end of the fixing portion as a fixing point, in a direction of the deflecting electric field, by arranging the slit in the charged particle optical system. The cantilever beam structure interferes with the transmission of the deforming stress to be transmitted from the fixing portion to the electrode supporting portion. Furthermore, even if a large deformation has occurred in the first member in the same unit, the unit is not almost affected by the deformation. Particularly, even when the deformation has complicated distribution, the structure can suppress the transmission of the deformation distribution to the electrode supporting portion. In addition, the slit can interfere with the transmission of heat from the outside of the electrostatic deflector. Because of this, the slit can reduce the deformation of the electrode supporting portion itself due to heat from the outside. In addition, even when the deformation is caused by generated heat in the first and second electrodes of the electrostatic deflector, the distribution of the gaps between the electrodes due to the heat deformation becomes simple distribution along a longitudinal direction of the cantilever beam. Because of this, it can be facilitated to adjust a voltage to be applied to electrodes for deflection and correct a scribing data by which an image is scribed along with the deflected beam.

As for another arrangement of the slit, the electrode supporting portion can be fixed to the fixing portion by means of a pair of cross-linking portions so as to sandwich the first and second electrodes. In this case, the slit substantially forms two cantilever beam structures which are expanded (extended) toward both sides in the direction of the deflecting electric field, from a line which connects the pair of the cross-linking portions. This line can be positioned approximately at the center portion of a length dimension of the electrode supporting portion in a direction of the electric field. Accordingly, each of the two substantially cantilever beam structures can have approximately the same length in this direction. With the two cantilever beam structures, the individual cantilever beam structure can be formed into a half size of the whole size of the electrode supporting portion. Because of this, even if the deformation due to the heat has occurred, the deformation amount of the electrode supporting portion can be reduced to half. Thus, the maximum amount of the position offset of the gap between the electrodes can be further reduced. In addition, the rigidity of the cantilever beam structure itself becomes high, and accordingly it can be further surely reduced that the electrode supporting portion is deformed by its own weight.

In addition, the charged particle optical system can employ a spring having elasticity in a direction of the deflecting electric field, as the stress suppressing structure. In this case, the electrode supporting portion is elastically supported to the fixing portion through at least one portion by such a spring. Even if large deformation has occurred in the fixing portion due to the deformation of the first member or the like, only a deforming stress corresponding to a spring constant is transmitted to the electrode supporting portion, and accordingly the deformation of the gap between the electrodes can be reduced. Furthermore, the spring has rigidity in a direction except the direction of the deflecting electric field, and accordingly can simultaneously reduce deformation due to its own weight or warpage of the electrode supporting portion. In addition, even if an unintentional shock is applied, the spring can prevent the electrode supporting portion from being damaged or deformed.

In addition, the charged particle optical system can be configured to have a control section that controls a power source to which the first and second electrodes are connected so as to generate the deflecting electric field in the gap between the electrodes. This control section can be designed as a control section which controls the potential of the power source so that the strength of the deflecting electric field becomes constant, while corresponding to the change of the dimension of the gap between the electrodes. Thereby, the deflection of the charged particle beams can be stabilized.

In addition, a scribing apparatus for scribing an image with charged particles according to a scribing pattern can be configured by using the charged particle optical system of the present invention. Here, the charged particle optical system has a blanker array which deflects a plurality of charged particle beams according to a scribing pattern. Furthermore, a stop aperture array having an opening which blocks the charged particle beams that have been deflected by the blanker array, and passes a beam that has not been deflected there-through is arranged in the rear stage of the blanker. This stop aperture array becomes a first member which generates heat and is deformed, because of selectively blocking the charged particle beams. The heat-generating portion and the heating value change depending on the scribing pattern, in particular. Accordingly, the deformation distribution in the stop aperture array is not constant, but changes depending on the scribing pattern. The electrostatic deflector which is the second member according to the present invention has a unit such as a stress suppressing structure that reduces the deforming stress of the stop aperture array. Because of this, even when the electrostatic deflector and the first member are installed so as to be close to each other, the scribing apparatus can scribe the image while reducing the dispersion of the deflection amount of the plurality of the charged particle beams. As a result, the whole size of the optical system can be minimized. In addition, when the optical system is configured, such that the beam diameter becomes small in the stop aperture array, if the electrostatic deflector can be installed so as to be close to the stop aperture array, the gap between the electrodes of the electrostatic deflector can also be decreased. Accordingly, the voltage to be applied to the electrostatic deflector can be lowered. Furthermore, if the gap between the electrodes can be decreased, an electrostatic deflector can be configured to simultaneously deflect an array of charged particle beams of high density by decreasing a pitch at which the gaps between the electrodes are arranged.

In addition, the charged particle optical system can be configured, such that the electrostatic deflector is fixed to the first member through the fixing portion, in order to reduce the transmission of the deforming stress from the first member toward the direction of the deflecting electric field. Such a configuration can reduce the deformation of the gap between the electrodes, without providing a special structure for the electrostatic deflector. Because of this, the structure of the electrostatic deflector can be simplified. For instance, the electrode supporting portion can be fixed to the first member so as to be a cantilever beam structure through the fixing portion in the direction of the deflecting electric field. The cantilever beam structure reduces the transmission of the deforming stress to be transmitted from the first member to the electrode supporting portion through the fixing portion. Thus, even if a large deformation has occurred in the first member in the same unit, the unit is not almost affected by the deformation. Particularly, even when the first member has a complicated deformation distribution, the structure can suppress the transmission of the deformation distribution to the electrode supporting portion. In addition, the electrode supporting portion is fixed at one portion, and accordingly the structure can reduce the transmission of heat from the outside of the electrostatic deflector. Because of this, the structure can reduce the deformation of the electrode supporting portion itself due to heat from the outside.

As for another fixing configuration, the charged particle optical system can be configured, such that both ends of the electrode supporting portion in the direction of the deflecting electric field of the electrostatic deflector are fixed to the first member by the fixing portion, respectively. Particularly, the charged particle optical system can be configured, such that any one of the both ends of the fixing portion in the direction of the electric field has a lower coefficient of elasticity than the other. The fixing portion having a lower coefficient of elasticity is substantially a spring, and results in elastically supporting the electrode supporting portion toward the direction of the deflecting electric field. For this reason, even if a large deformation has occurred in the fixing portion, only a deforming stress corresponding to a substantial spring constant is transmitted to the electrode supporting portion, and accordingly the deformation of the gap between the electrodes can be reduced. Furthermore, the electrode supporting portion is fixed in a direction except the direction of the deflecting electric field, and accordingly the structure can simultaneously reduce deformation due to its own weight and warpage of the electrode supporting portion. In addition, even if an unintentional shock has been applied, the spring can prevent the electrode supporting portion from being damaged or deformed.

The present invention will be described further in detail below with reference to examples, but the present invention is not limited to these examples.

Example 1

Figure 2:
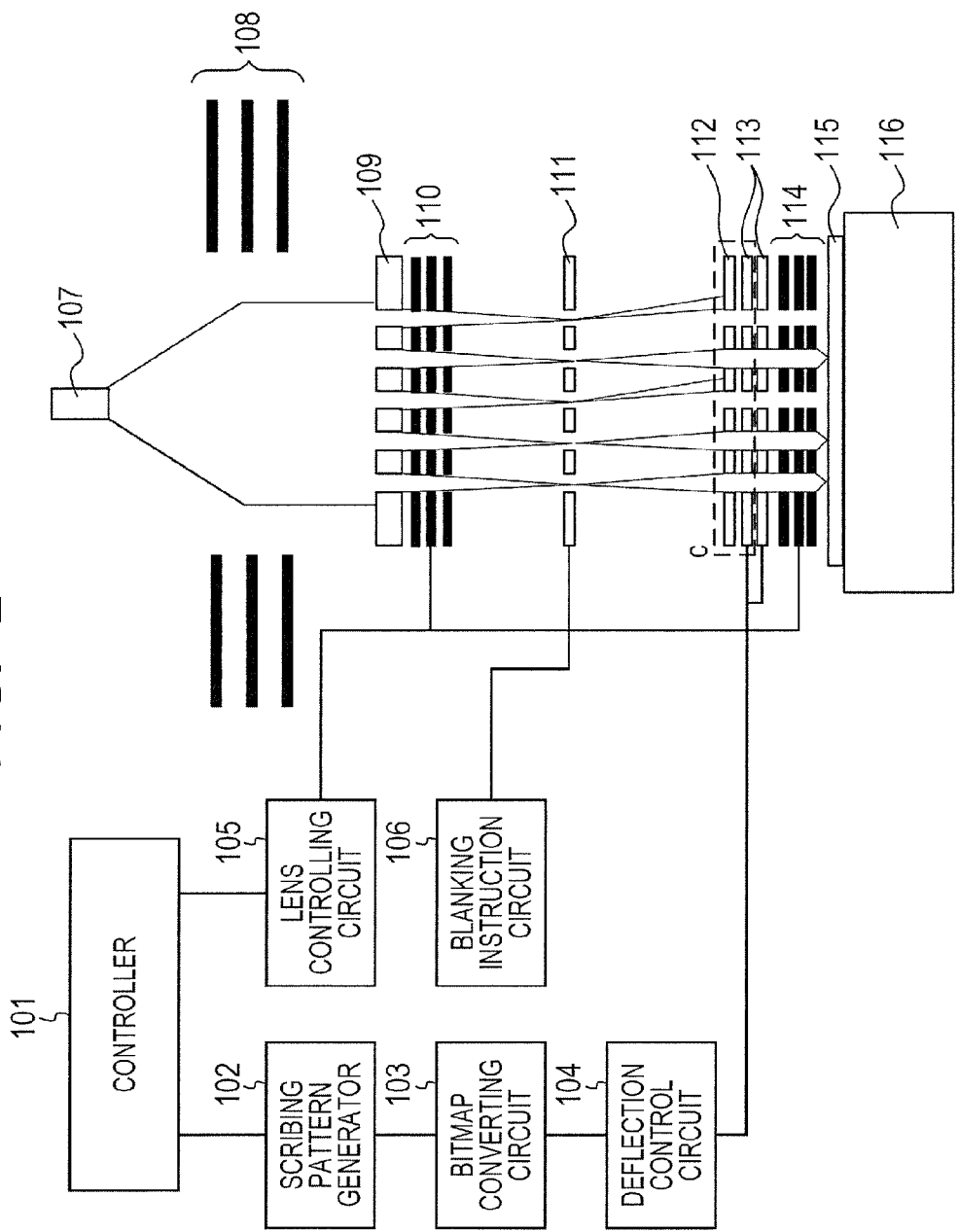
FIG. 2 is a schematic view illustrating a configuration of a scribing apparatus of the present invention.

FIG. 2 illustrates a configuration of a charged particle scribing apparatus using a charged particle optical system of the present invention. Here, the charged particle is an electron. Electron beams are emitted from an electron source 107, are converted into parallel beams by a collimating lens 108, and are irradiated on an aperture array 109. A plurality of the electron beams which have been divided by the aperture array 109 are individually focused by a focusing lens array 110 that is controlled by a lens controlling circuit 105, and form images on a blanker array 111. The blanker array 111 is a device having individually deflecting electrodes therein. The blanker array turns the individual beams ON/OFF according to a scribing pattern based on a blanking signal generated by a scribing pattern generator 102, a bit map converting circuit 103, and a blanking instruction circuit 106. When the beam is in the ON state, a voltage is not applied to the deflecting electrodes of the blanker array 111, and when the beam is in the OFF state, the voltage is applied to the deflecting electrodes of the blanker array 111 to deflect multiple electron beams.

The multiple electron beams which have been deflected by the blanker array 111 are selectively blocked by or pass through the stop aperture array 112 which is a first member provided in the rear stage. Thus, the beam becomes one of the OFF and ON state. The electron beams which have passed through the stop aperture array 112 are deflected by an electrostatic deflector 113. The deflector 113 includes a pair of electrodes which face each other, and here, two electrostatic deflectors are arranged in order to deflect the electron beam in the deflecting direction in two stages. These electrostatic deflectors 113 are driven according to signals of the deflection control circuit 104. Finally, the plurality of the electron beams is reduced by an object lens array 114, and forms images on a wafer 115. The wafer 115 is continuously moved by a stage 116 while the pattern is scribed. The beams are individually turned ON/OFF by the blanker array 111 according to the scribing pattern. Thereby, a desired pattern can be scribed on the surface of the wafer 115 at high speed. A controller 101 controls the whole circuit.

Figure 1B:
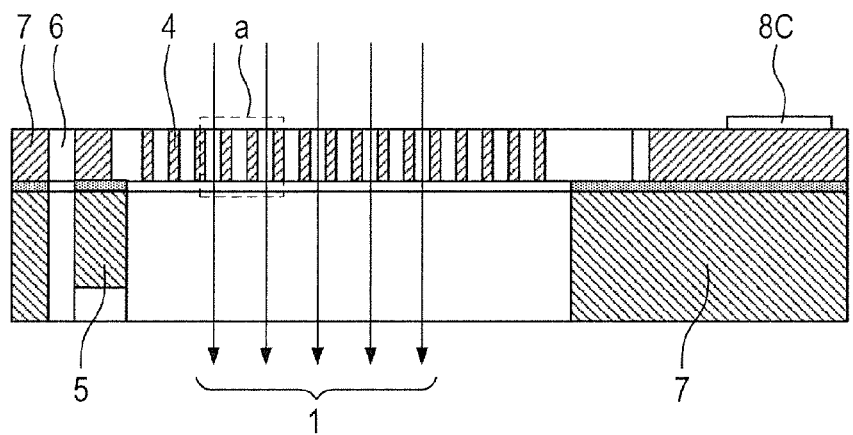
Figure 3A:
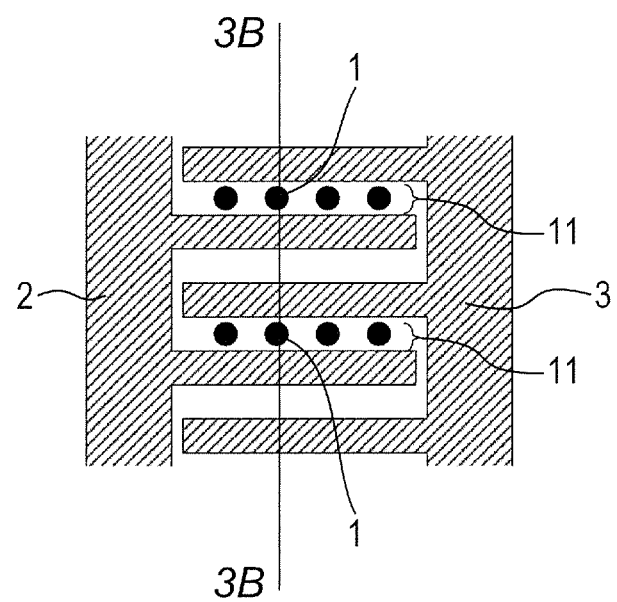
FIGS. 3A and 3B are schematic views illustrating an electrode structure of the electrostatic deflector of the present invention.
Figure 3B:
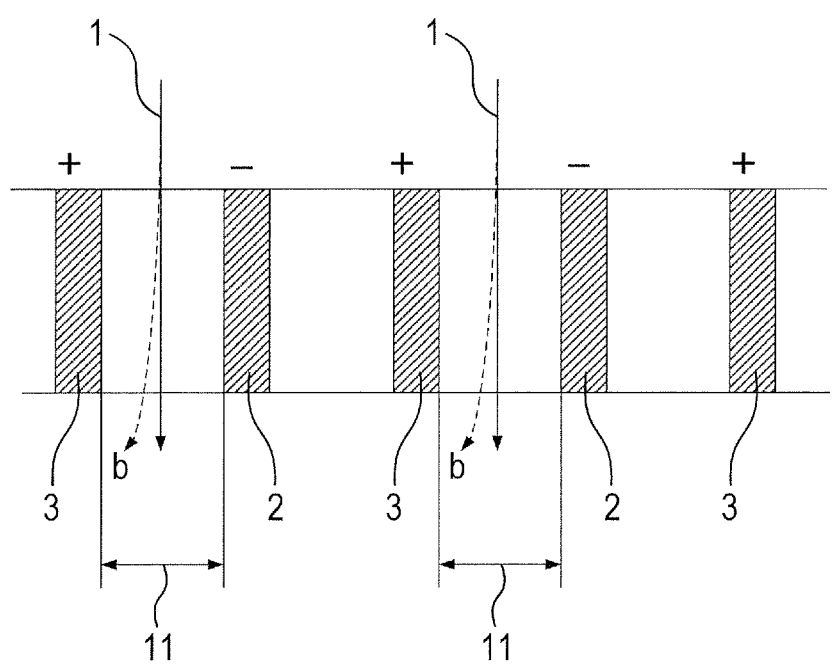

In the present example, the stop aperture array 112 and the electrostatic deflector 113 which are shown by a dashed line C of FIG. 2 are configured to be assembled as a unit. However, here, the two electrostatic deflectors are used, and accordingly an electrostatic deflector in a lower stage is also incorporated in the unit, though the electrostatic deflector is not surrounded by the dashed line C. In FIGS. 1A and 1B and FIGS. 3A and 3B, the electrostatic deflector 113 of the present example is illustrated. FIG. 1A is a top plan view of the electrostatic deflector; FIG. 1B is a sectional view taken along the line 1B-1B of FIG. 1A; and FIGS. 3A and 3B are enlarged views of a portion surrounded by a dashed line a in FIGS. 1A and 1B. The electrostatic deflector 113 has a first electrode 2 and a second electrode 3 on an electrode supporting portion 5, as is illustrated in FIG. 1A. The electrode supporting portion 5 is supported by a fixing portion 7. In addition, a slit 6 is provided as a stress suppressing structure, as is illustrated in the figure. The slit 6 is configured, such that the electrode supporting portion 5 becomes a cantilever beam structure, of which one end is fixed at the fixing portion 7 as a fixing point. This cantilever beam structure is formed in an X direction which is the direction of an electric field that deflects the electric beam, which will be described later.

Each of the first electrode 2 and the second electrode 3 has a plurality of slim comb tooth electrodes 4, as is illustrated in the figure. The comb tooth electrodes are arranged so as to dovetail with each other and face each other. The first electrode 2 and the second electrode 3 have power-feeding pads 8A and 8B which are connected to a not-shown power source, such that each of the potentials can be set. The electrode supporting portion 5 and the fixing portion 7 are configured, such that a potential different from the potentials of the first and second electrodes can be defined on the portions, and have a power-feeding pad 8C to define the potential. A plurality of electron beams 1 pass through gaps between the comb tooth electrodes 4 of the first electrode 2 and the comb tooth electrodes 4 of the second electrode 3 in the normal direction of paper, as is shown by black dots of FIG. 1A. Here, the electron beams are arrayed in the Y direction along the gaps formed by the comb tooth electrodes 4 of the first electrode 2 and the second electrode 3.

The electron beams are deflected toward the X direction by the electric field generated in the gap. The deflection will be described below with reference to FIGS. 3A and 3B. FIGS. 3A and 3B show a view for describing the state of electrodes, in which a negative potential is applied to a first electrode 2 and a positive potential is applied to a second electrode 3, and a direction of an electric field generated in the gap. As is illustrated in FIG. 3A, comb tooth electrodes of the first and second electrodes constitute gaps 11. In the gaps 11, the electric field is generated in the X direction. Four electron beams 1 pass through the one gap 11. The electric fields in the same direction are generated in the respective gaps 11, as is illustrated in FIG. 3B. All of the eight electron beams illustrated in the figure can be deflected toward the direction as is shown by a dashed line b of FIG. 3B. In other words, the gaps which have been generated by the dovetail of the comb teeth are configured, such that the electron beams pass through every other gap in order that the directions of the electric fields which act on the electron beams become the same. The gap which thus makes the electron beams pass there-through and deflects the electron beams is particularly defined as the gap 11.

Figure 4A:
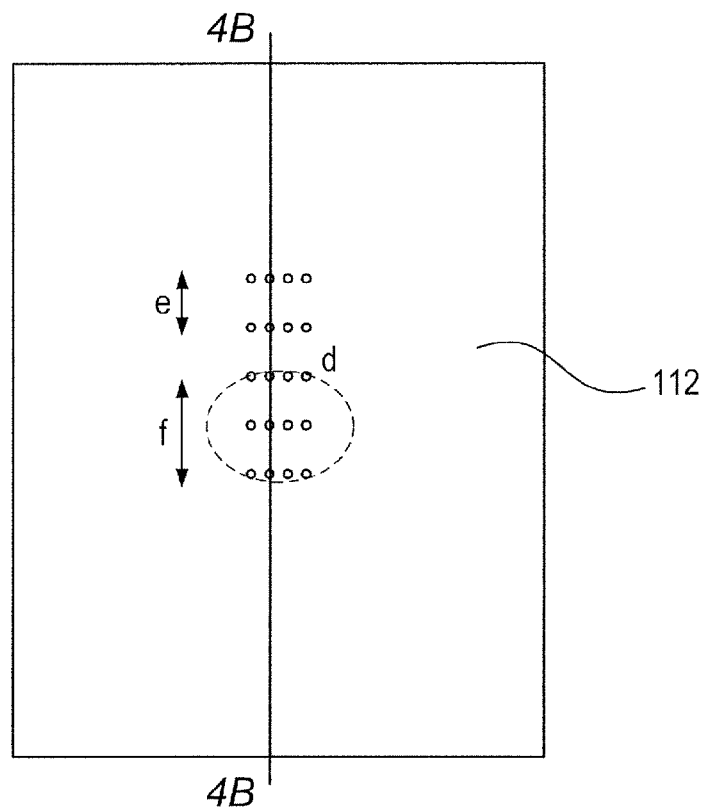
FIGS. 4A and 4B are schematic views for describing a conventional electrostatic deflector.
Figure 4B:
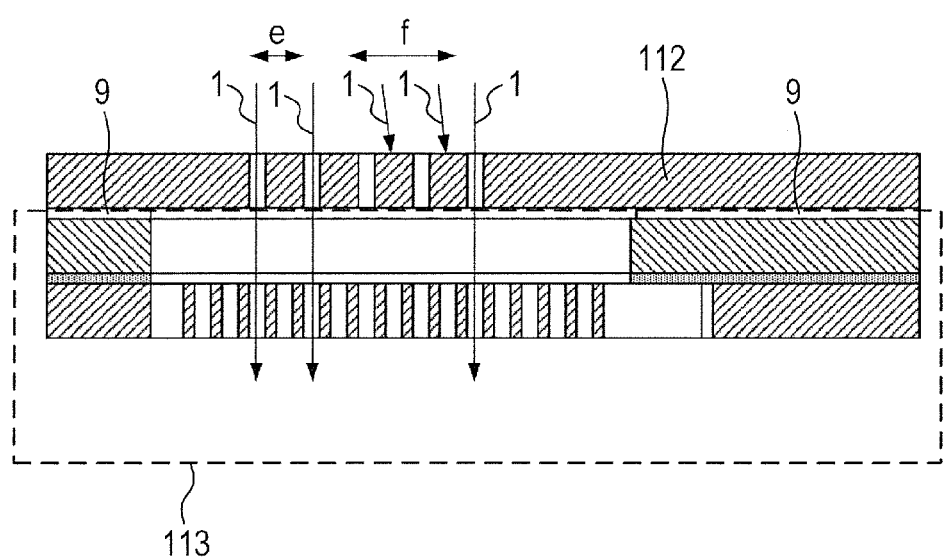

As is illustrated in FIGS. 1A and 1B, the electrode supporting portion 5 of the present example has a slit 6 formed, so as to form a cantilever beam structure pivotal in the X direction of the electric field which deflects the electron beam. Next, an effect of reducing a deforming stress by the slit 6 will be described below with reference to FIGS. 4A and 4B and to FIGS. 5A and 5B. Firstly, a situation in which the distribution of the deforming stress occurs in the stop aperture array 112 will be described below with reference to FIGS. 4A and 4B. FIGS. 4A and 4B show a view for describing a unit of the stop aperture array 112 and an electrostatic deflector 113, which is shown by a dashed line c of FIGS. 2A and 2B. FIG. 4A is a top plan view of the unit when viewed from a stop aperture array 112 side. FIG. 4B is a sectional view taken along the line 4B-4B of FIG. 4A. Now, consider the case in which three electron beams 1 pass through the stop aperture array 112 and two electron beams 1 are blocked by the stop aperture array 112 as is illustrated in FIG. 4B, for the sake of description. Which electron beam passes through or is blocked varies according to a scribing pattern. Because heat is generated by the blockage, the temperature of such a portion as is shown by a dashed line d tends to become high, in which many beams 1 are blocked. In such a portion of which the temperature is high, large expansion occurs compared to the portion of which the temperature is not high. Accordingly, the distribution of the deforming stresses results in occurring as is shown by an arrow e and an arrow f which show the magnitudes of the stresses. As is illustrated in FIG. 4B, the fixing portion of the electrostatic deflector 113 is fixed to the stop aperture array 112 through a joining surface 9.

Figure 5A:
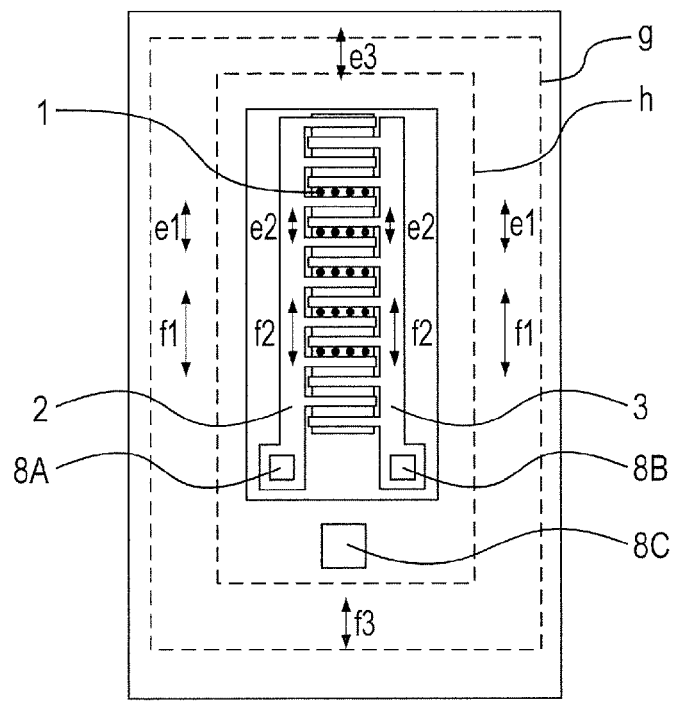
FIGS. 5A and 5B are views for describing an action of the electrostatic deflector of the present invention.
Figure 5B:
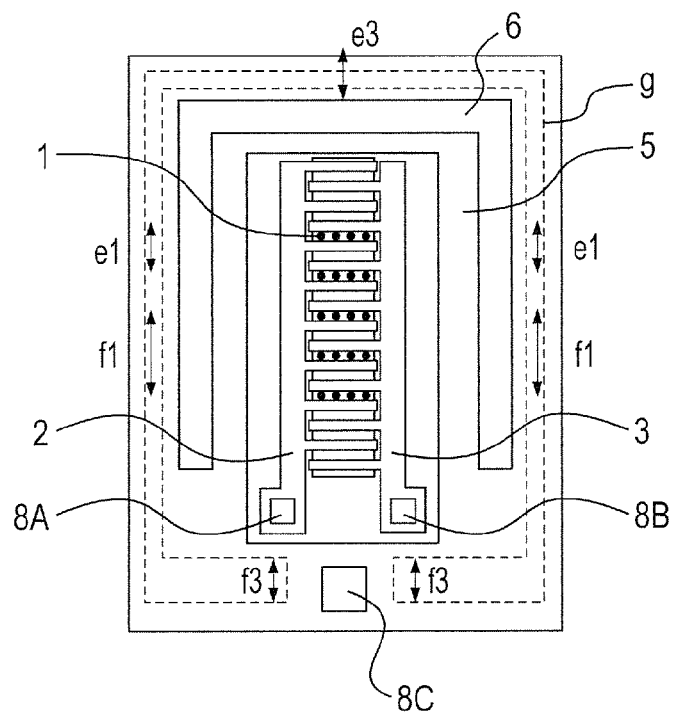

Next, it will be described how a deforming stress of the stop aperture array 112 is transmitted to the electrostatic deflector 113, with reference to FIGS. 5A and 5B. FIG. 5A illustrates the case of a conventional electrostatic deflector, and FIG. 5B illustrates the case of an electrostatic deflector of the present example. A region surrounded by a dashed line g and a dashed line h of FIG. 5A is the joining surface 9 illustrated in FIG. 4B. The deforming stress e and f illustrated in FIG. 4A are transmitted to the electrostatic deflector, firstly through the joining surface 9, as are shown by arrows e1, f1, e3 and f3. These deforming stresses are also transmitted to the first electrode 2 and the second electrode 3 which are arranged on the same chip, as are shown by arrows e2 and f2. In other words, not only the deforming stress of the stop aperture array 112 is transmitted, but also the distribution of the deforming stress is transmitted in the state when the distribution of the deforming stress occurs. Accordingly, the gaps of the first and the second electrodes 2 and 3 also result in expanding and contracting in this direction. In such a situation, a dispersion of deflection for the plurality of the electron beams 1 is generated in each gap through which the electron beams 1 pass.

On the other hand, a region surrounded by a dashed line g of FIG. 5B becomes the joining surface 9 illustrated in FIG. 4B. Accordingly, the deforming stress of the stop aperture array 112 is transmitted to the fixing portion 7 through the joining surface 9, as is shown by arrows e1, f1, e3 and f3. However, the deforming stress is not almost transmitted to the electrode supporting portion 5, due to the stress suppressing structure 6 (slit). Accordingly, the slit 6 can prevent the gap formed by the first and second electrodes 2 and 3 from expanding and contracting due to the deforming stress of the stop aperture array 112. In addition, heat in the stop aperture array 112 is transmitted to the fixing portion 7 by the joining surface 9. However, the slit 6 which has been formed as the stress suppressing structure functions as a heat insulation structure, and accordingly can reduce the transmission of the heat toward the electrode supporting portion 5. In addition, also when the first electrode 2 and second electrode 3 generate heat and the electrode supporting portion 5 is deformed, the distribution of the deforming stress becomes a simple distribution in which the deforming direction is parallel to a longitudinal direction of the cantilever beam structure, due to the stress suppressing structure (slit) 6. As a result, the gaps 11 also expand and contract to form the simple distribution. Because of this, it can be facilitated to adjust a voltage for deflection and correct a scribing data by which an image is scribed along with the deflection.

Next, an example of a dimension of the electrostatic deflector of the present example will be described below. The first and second electrodes 2 and 3 are arranged so that the electrodes face each other and the gap 11 becomes 30 µm. Each of the comb tooth electrodes 4 which are formed in each of the electrodes has a width (that is dimension in X direction in which gap 11 is formed) of 30 µm and a length (in Y direction perpendicular to width) of 0.5 mm. In addition, the thickness is 0.1 mm. The electron beams 1 are arrayed with a pitch of 150 µm. The first and second electrodes 2 and 3 are arranged on the electrode supporting portion 5 through an insulating film having holes for passing beams there-through, and simultaneously deflect a plurality of electron beams by potentials of approximately +10 V and −10 V which have been applied to the power-feeding pads 8A and 8B, respectively. Incidentally, the present configuration is described so as to have been manufactured with a manufacturing method using an SOI substrate that will be described later, and accordingly is described in such a way that the above described insulating film having the holes for passing the beams there-through is an oxide film which is embedded in the SOI substrate.

A method for manufacturing the electrostatic deflector of the present example will be described below. The electrostatic deflector having a dimension order as described above can be manufactured with an MEMS (Micro-Electro-Mechanical-Systems) technology to which a semiconductor manufacturing technology is applied. First, an SOI (silicon-on insulator) substrate is prepared. The thickness of a device layer which is a thin film silicon layer of the SOI substrate is set at 0.1 mm that is the thickness of the first and second electrodes 2 and 3 of the electrostatic deflector to be manufactured. An etching mask is formed on this thin film silicon layer by lithography, and a comb tooth structure is formed by dry deep etching for the silicon. The etching is stopped at the oxide film which is embedded in the SOI substrate. After that, the through hole through which electron beams pass is formed in a handle layer of the SOI substrate by the lithography and by the dry deep etching for the silicon, and an unnecessary embedded oxide film is removed.

Thus, an electrostatic deflector with the fine structure can be formed as in the above described dimension example. The electrode supporting portion 5, the stress suppressing structure (slit) 6 and the fixing portion 7 can be simultaneously formed, in the step of forming the first and second electrodes and the step of forming the through hole through which the electron beams pass. As described above, the stress suppressing structure can be formed without providing a special step by applying the MEMS technology as a manufacturing technology. In addition, according to the MEMS technology, the fine structure can be accurately manufactured, and accordingly such a deflector can be manufactured as to deflect the electron beams that are densely arrayed.

Example 2

Figure 6A:
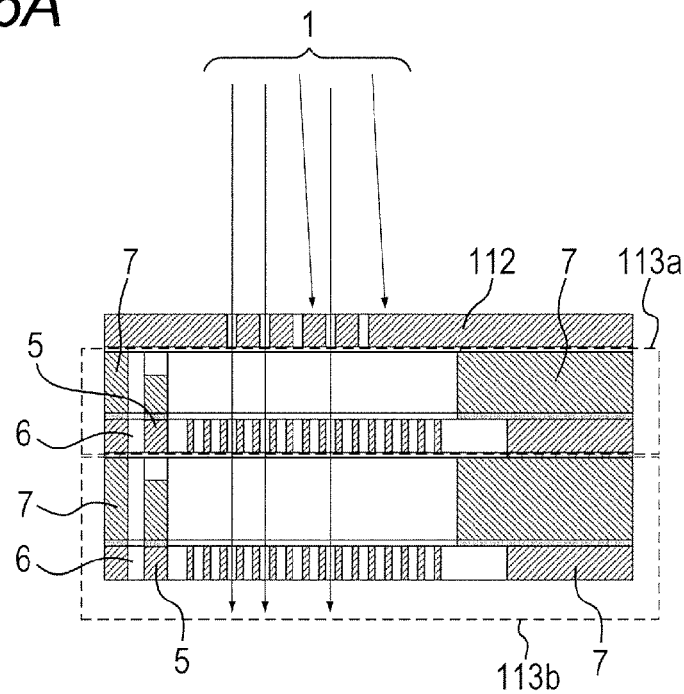
FIGS. 6A and 6B are schematic views illustrating an electrostatic deflector according to Example 2 of the present invention.

Example 2 of the present invention will be described below with reference to FIGS. 6A and 6B. The portions having the same functions and effects as in Example 1 are denoted by the same symbols, and the description will be omitted. The present example is different from Example 1 in a point that two electrostatic deflectors 113 are used so as to form two-stage deflectors. FIG. 6A illustrates a configurational cross section of a unit of the present example which almost corresponds to a unit shown by a dashed line c of FIGS. 2A and 2B. The two electrostatic deflectors 113a and 113b are assembled under a stop aperture array 112 as is illustrated in the figure.

In the present example, the electrostatic deflectors 113a and 113b have a cantilever beam structure pivotal in relation to a fixing portion 7 by a stress suppressing structure 6 (slit), as is illustrated in FIGS. 1A and 1B. The cantilever beam structure of the two electrostatic deflectors is assembled so that fixed ends are arranged in the same side with respect to the X direction. The deflection in two stages enables the deflection which sets a certain arbitrary one point as the center. The action of such a deflector will be described below with reference to FIG. 6B.

Figure 6B:
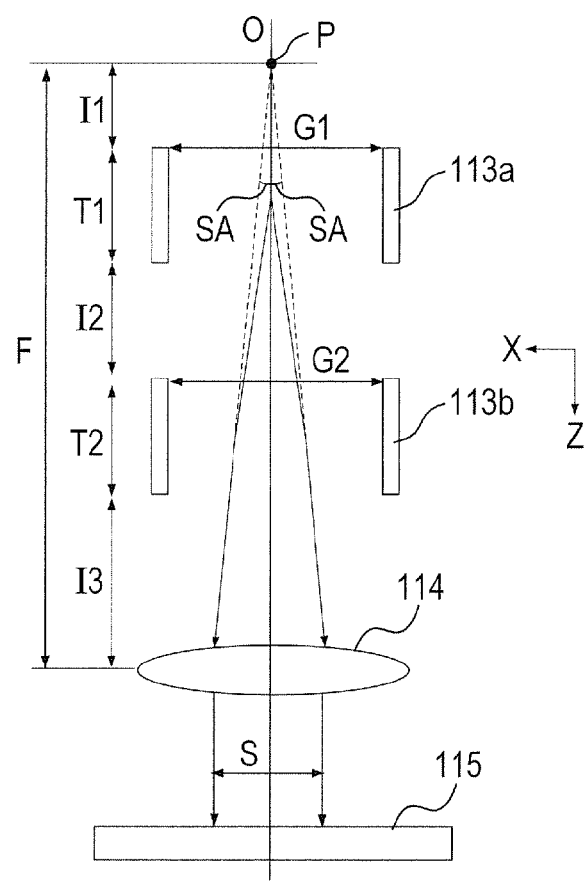

FIG. 6B illustrates gaps 11 (see FIGS. 3A and 3B) of two electrostatic deflectors 113a and 113b and their positional relationship. An optical axis O as in the figure is considered for the two electrostatic deflectors 113a and 113b. Suppose that electron beams are deflected by an angle SA formed with respect to the optical axis when regarding the point P as the center, in two stages. At this time, widths of the gaps 11 of the electrostatic deflectors are represented by G1 and G2, respectively. In addition, a distance between the point P and the electrostatic deflector 113a in the first stage is represented by I1, the height of the electrostatic deflector in the first stage is represented by T1, a distance between the electrostatic deflectors 113a and the 113b is represented by I2, and the height of the electrostatic deflector 113b in the second stage is represented by T2. In addition, a distance between the electrostatic deflector 113b in the second stage and an object lens array 114 which is placed in the rear stage of the electrostatic deflectors of the two stages is represented by I3. Furthermore, the electrostatic deflectors are arranged so that a position of a focal distance F of the object lens array is the point P. At this time, if potential differences which are applied to the gaps 11 of the two electrostatic deflectors 113a and 113b are appropriately selected, the electron beams can be deflected so as to be equivalent to the deflection by the angle SA, which regards the point P as the center, as a result of two times of deflections, as are shown by an arrow of a solid line shown in the figure. Such a deflection enables the electron beams 1 after having passed through the object lens array 114 to be deflected so that the beams are shifted by a distance S to be parallel, as is illustrated in the figure.

As is illustrated in FIGS. 6A and 6B, when a direction in which the electron beams pass is represented by a Z direction, a direction of the gaps 11 is represented by an X direction, an accelerating voltage for the electron beam is represented by $\phi$, and an incident angle of the electron beam to the electrostatic deflector, which is formed by the electron beam and the optical axis O, is represented by $\theta$, a translation amount p deflected by one electrostatic deflector is represented by the following expression.

$$p = -(T^2 V/4G\phi) \times (1/\cos \theta)^2 + T \times \tan \theta \quad (1)$$

Here, a height of the electrostatic deflector is represented by T, the gap width is represented by G, and a potential difference across the gap is represented by V. When considering that the electron beams go straight in a section in which the electron beams are not deflected, the translation amount and the deflection angle at a position of the final object lens array 114, which has been achieved by the electrostatic deflectors in the two stages illustrated in FIG. 6B, can be calculated by sequentially applying Expression 1 and the inclination to the electrostatic deflectors. In the present example, the values of the dimensions of the configuration of the electrostatic deflectors in the two stages are the following values. F=0.5 mm, I1=0.1 mm, T1=0.1 mm, I2=0.15 mm, T2=0.05 mm, I3=0.1 mm, G1=0.03 mm and G2=0.03 mm. At this time, in order to deflect the electron beams so that the angle SA is 4 m radian and the distance S is 4 µm (±2 µm), the maximum voltages to be applied to the electrostatic deflectors 113a and 113b result in being ±10 V and ±8 V, respectively.

Figure 10A:
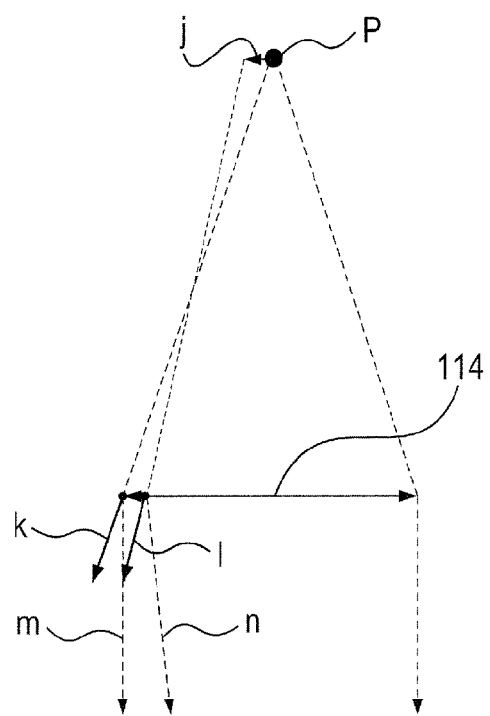
FIGS. 10A and 10B are views for describing a deflection error and a shift error.
Figure 10B:
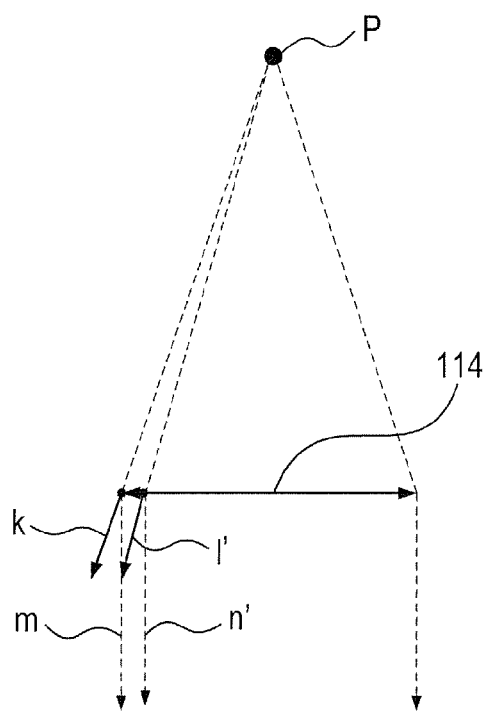

Here, a deflection error occurring when gap widths G1 and G2 are expanded or contracted will be described below with reference to FIGS. 10A and 10B. FIG. 10A illustrates the case in which errors have occurred in each of a translation amount and a deflection angle of the emitted electron beams, because the electron beams have passed through the electrostatic deflectors in the two stages, and as a result, errors have occurred in the gap widths G1 and G2. An arrow k illustrates the case in which the electron beam is ideally deflected. In the case of the arrow k, the inclination of a dashed line which connects a deflection center point P and the position of the arrow k coincides with the inclination of the arrow k. Accordingly, the deflection can be achieved that is equivalent to the deflection which has occurred as a result of the deflection in the two stages and regards the point P as the center. After the electron beam has passed through the object lens array 114, the beam parallel to the optical axis O is emitted as is shown by an arrow m.

On the other hand, an arrow l illustrates the case in which errors have occurred in the gap widths G1 and G2. The arrow l has errors of the position and the inclination with reference to the arrow k. It can be considered that the arrow l illustrates the case in which the electron beam is deflected with the point P having a shift error j as the deflection center. In such a case, the electron beam passes through the object lens array 114, and then is emitted so as to have the inclination with respect to the optical axis O, as is shown by the arrow n. Because of this, when a pattern is scribed on the wafer 115, a beam spot results in being blurred, and an error results in occurring in the scribed position.

In the configuration of the present example, when G1 has an error of 0.0001 mm with reference to 0.03 mm, the shift error results in being 3 nm. In addition, when G2 has an error of 0.0001 mm with reference to 0.03 mm, the shift error results in being 3 nm. When the pattern to be scribed on the wafer 115 is as fine as several tens nm order, the influence of the shift error of several nm order as described above cannot be ignored. Then, an effect of the deflectors in the present example will be described below with reference to FIG. 10B, in which cantilever beam structures of two electrostatic deflectors are assembled so that the ends which are fixed to fixing portions are located in the same direction. If the fixed are located in the same direction, and the cantilever beam structures are expanded or contracted in the same direction, the shift error can be reduced even when errors have occurred in the gap widths G1 and G2. With regard to the translation amount and the deflection angle, an arrow l' has an error from the arrow k which shows ideal deflection. However, even though the error has occurred, a ratio of the translation amount and the deflection angle is almost kept, and accordingly the shift error is reduced as in a dashed line which has been extended from a starting point of the arrow l'. In such a case, the beam after having passed through the object lens array 114 becomes an arrow n', and can be deflected to be parallel to the optical axis O, though the position deviates. Therefore, the blurring of the beam spot and the error of the scribed position on the wafer 115 can be reduced. In addition, when the directions of the errors of G1 and G2 coincide with each other, in other words, when both of G1 and G2 are expanded or contracted, the shift error can be reduced as described above. In addition, when the amount is the same degree, the shift error can be further reduced.

If the fixed ends of the cantilever beam structures of the two electrostatic deflectors are located in the side in the same direction as is illustrated in FIG. 6A, the deformation distributions of the electrode supporting portions 5 of the two electrostatic deflectors can be approximately the same. Because of this, the directions and the amounts of the deformation errors of the gaps 11 which form a pair and deflect the electron beams in the two stages can be approximately the same, for all of the plurality of the gaps 11 formed on the electrode supporting portions 5. Therefore, the shift errors can be reduced. In addition, the cantilever beam structure is expanded or contracted with reference to the fixed end, and accordingly the mutual position offset of the gaps 11 which form the pair and deflect the electron beams in the two stages can also be reduced.

Example 3

Figure 7A:
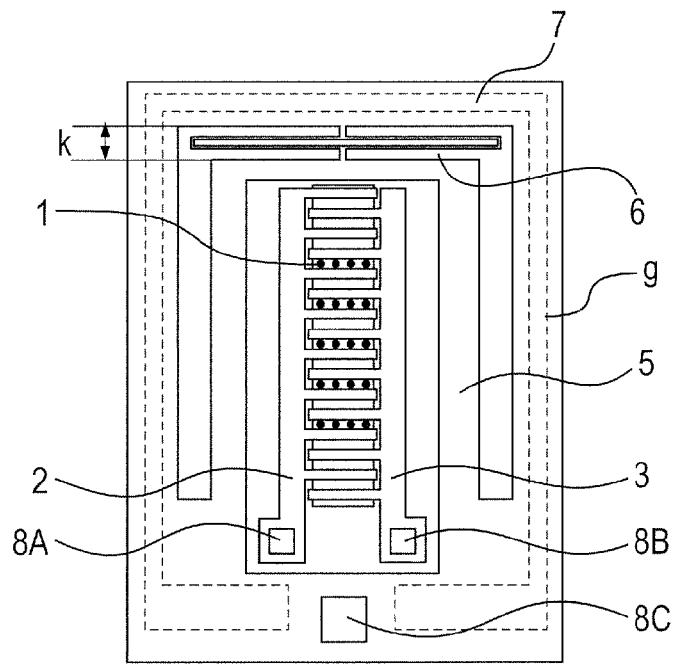
FIGS. 7A and 7B are schematic views illustrating electrostatic deflectors according to Examples 3 and 4 of the present invention.

Example 3 of the present invention will be described below with reference to FIG. 7A. The portions having the same functions and effects as in Example 1 are denoted by the same symbols, and the description will be omitted. The present example is different from Example 1 in a stress suppressing structure which an electrostatic deflector 113 has. FIG. 7A illustrates a top plan view of an electrostatic deflector 113. A spring 6 having a spring constant in the direction shown by the arrow k is arranged as the stress suppressing structure. Even though deformation Δx is transmitted to a fixing portion 7, an electrode supporting portion 5 receives only a deforming force of kΔx due to the spring constant k. The deforming force transmitted to the electrode supporting portion 5 can be reduced by appropriately selecting the spring constant k.

In addition, the spring 6 illustrated in the figure has such a structure that the spring 6 is ductile in the arrow k direction but is firm in other directions. Accordingly, the structure can prevent the electrode supporting portion 5 from being flexed by its own weight or by an internal stress of a component material. The structure also can prevent the electrode supporting portion 5 from being largely displaced and damaged by an applied impact. The electrostatic deflector 113 of the present example also can be manufactured by a similar manufacturing method as in Example 1.

Example 4

Figure 7B:
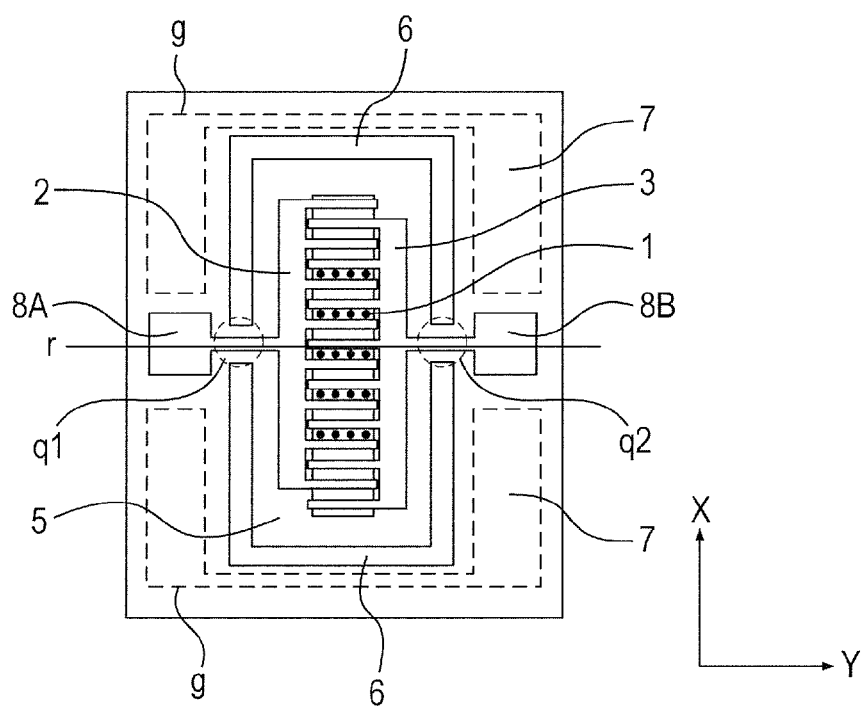

FIG. 7B illustrates a top plan view of the electrostatic deflector 113 of Example 4 of the present invention. The electrostatic deflector 113 has a slit 6 as a stress suppressing structure. However, the arrangement of the slit 6 is different from Example 1. The electrode supporting portions 5 are configured to face each other at the center of the X direction and be fixed to fixing portions on two cross-linking portions, as are shown by dashed line q1 and q2. The electrode supporting portions 5 substantially become a cantilever beam structure which extends in both positive and negative directions of the X direction, when viewed from a line r that connects q1 and q2. The sizes of each of the cantilever beam structures can be reduced to half of the size of the same electrode supporting portion, by providing the two cantilever beam structures. Because of this, even if the deformation due to the heat has occurred, the deformation amount of the electrode supporting portion can be decreased to half. Thus, the structure can reduce the maximum amount of the position offset of the gap 11 between the electrodes. In addition, the rigidity of the cantilever beam structure itself increases, and accordingly deformation by its own weight can be reduced. The electrostatic deflector 113 of the present example also can be manufactured by a similar manufacturing method as in Example 1.

Example 5

Figure 8A:
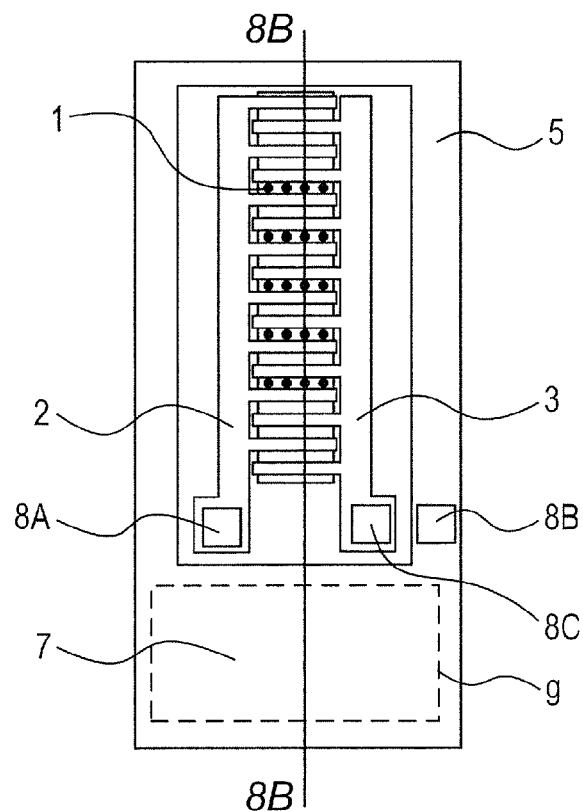
FIGS. 8A and 8B are schematic views illustrating an electrostatic deflector according to Example 5 of the present invention.
Figure 8B:
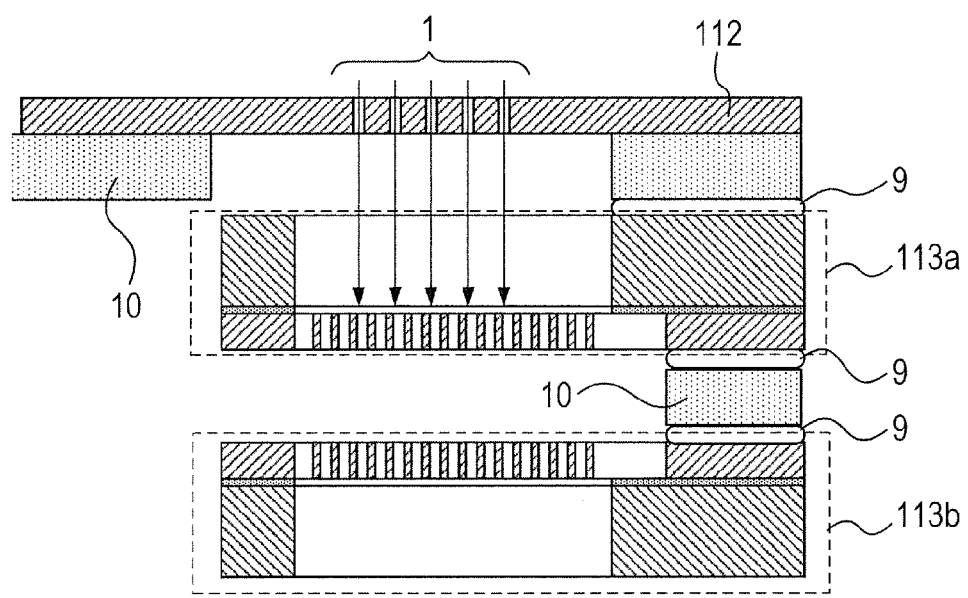

Example 5 of the present invention will be described below with reference to FIGS. 8A and 8B. The portions having the same functions and effects as in Example 1 are denoted by the same symbols, and the description will be omitted. In the present example, a fixing structure of placing an electrostatic deflector 113 thereto can reduce the deformation of an electrode supporting portion 5. FIG. 8A is a top plan view of the electrostatic deflector 113 of the present example. In addition, FIG. 8B is a cross-sectional view of the whole of the unit shown by a dashed line c in FIG. 2, at a position of the line 8B-8B of FIG. 8A. In the electrostatic deflector of the present example, a part of the electrode supporting portion 5 becomes a fixing portion 7. The fixing portion 7 is defined as a region in which a spacer 10 that is fixed to a stop aperture array 112 and a range shown by a dashed line g are bonded to each other on a joining surface 9. The electrostatic deflectors 113a and 113b are stacked to form two stages through a spacer 10, as is illustrated in FIG. 8B. The electrode supporting portions 5 can have a cantilever beam structure by setting only a region shown by a dashed line g to be the fixing portion 7. Accordingly, the transmission of the deformation from the stop aperture array 112 can be reduced. Particularly, in the present example, a special stress suppressing structure does not need to be provided on the electrostatic deflector, and accordingly the structure can be simplified. In addition, a chip area of the electrostatic deflector can be decreased. Accordingly, when the electrostatic deflector is manufactured by applying a semiconductor manufacturing technology, the number of the chips taken from one wafer increases, and the electrostatic deflector can be inexpensively manufactured.

Example 6

Figure 9A:
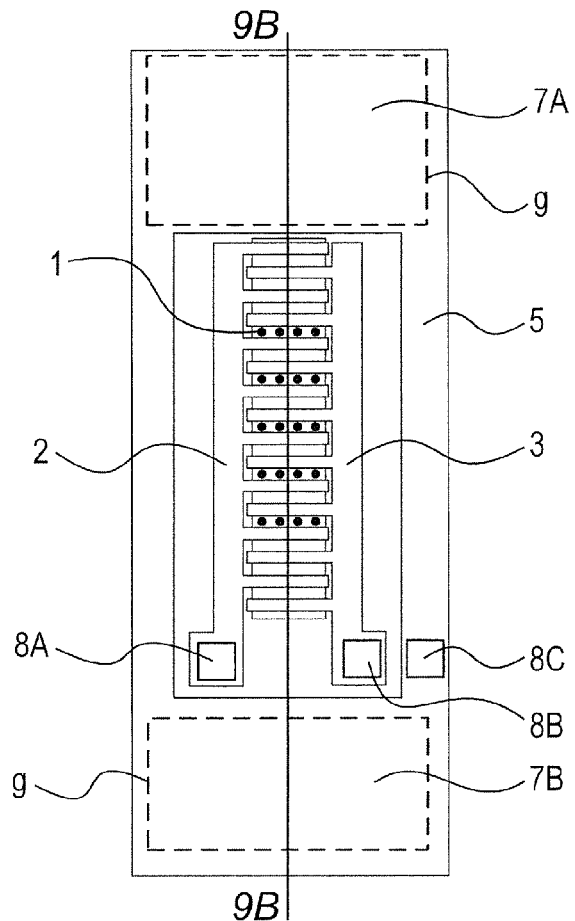
FIGS. 9A and 9B are schematic views illustrating an electrostatic deflector according to Example 6 of the present invention.
Figure 9B:
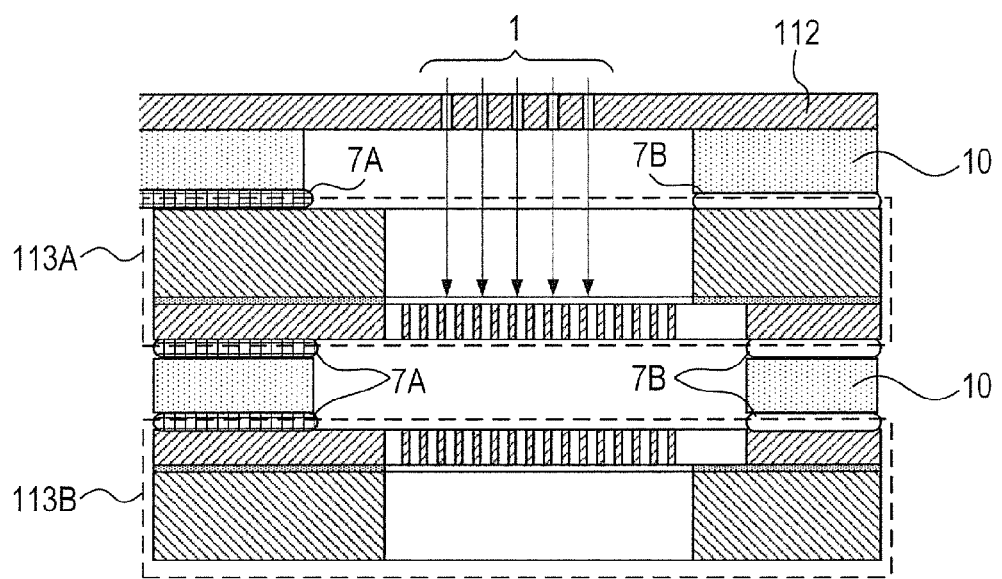

Example 6 of the present invention will be described below with reference to FIGS. 9A and 9B. FIG. 9A is a top plan view of an electrostatic deflector 113 of the present example. In addition, FIG. 9B is a cross-sectional view of the whole of the unit shown by a dashed line c of FIG. 2, at a position of the line 9B-9B of FIG. 9A. In the electrostatic deflector of the present example, two portions of the electrode supporting portions 5 surrounded by a dashed line g are bonded to the spacers 10 which are fixed to the stop aperture array 112, as fixing portions 7A and 7B. The coefficient of elasticity of the fixing portion 7A is set so as to be lower than the coefficient of elasticity of the fixing portion 7B. For instance, an epoxy adhesive can be used for the fixing portion 7B, and a silicone resin-based liquefied rubber which becomes an elastic body after having been cured can be used for the fixing portion 7A.

The electrode supporting portion 5 is substantially elastically supported by the elastic body of the fixing portion 7A. Because of this, the transmission of the deformation from the stop aperture array 112 can be reduced. The effect of reducing the transmission according to the substantial spring constant can be obtained by selecting a bonding material of the fixing portion 7A. Furthermore, in the present example, both ends of the electrode supporting portion 5 are fixed, and accordingly the structure can prevent the electrode supporting portion from being flexed by its own weight or by an internal stress of a component material. The structure also can prevent the electrode supporting portion 5 from being largely displaced and damaged by an applied impact. In addition, the two placing portions can be set to be both ends of the electrode supporting portion 5, and a large span can be adopted for adjusting the placing positions. Particularly, the electrostatic deflectors can be installed so as to be vertical to the trajectory of the electron beams.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-245004, filed Nov. 9, 2011, which is hereby incorporated by reference herein in its entirety.

What is claimed is:

1. An optical system for a charged particle, the optical system comprising:
    a first member through which a charged particle beam is transmitted; and
    a second member configured to control optically the charged particle beam transmitted through the first member, wherein the second member has a fixing portion fixed to the first member, and a slit arranged between a part of the second member and the fixing portion to separate the part of the second member from the fixing portion, wherein the slit is configured such that the part of the second member is a cantilever beam structure pivotal in relation to the fixing portion.

2. The optical system according to claim 1, wherein the first member is a stop aperture array configured to transmit selectively the charged particle.

3. The optical system according to claim 2, wherein the second member is one of the stop aperture array, an electrostatic lens, and an electrostatic deflector.

4. The optical system according to claim 1, wherein the first member is a beam forming member.

5. The optical system according to claim 4, wherein the second member is one of an electrostatic lens and an electrostatic deflector.

6. The optical system according to claim 1, wherein the second member is the electrostatic deflector, which comprises an electrode supporting portion as part of the second member, and first and second electrodes supported by the electrode supporting portion, wherein a gap is formed between the first and second electrodes configured to generate an electrical field for deflecting the charged particle beam, and the electrode supporting portion is connected to the fixing portion.

7. The optical system according to claim 1, wherein the second member is the electrostatic lens, which comprises a plurality of electrodes, each having at least one through hole, and an insulating spacer being arranged between the electrodes to define a gap between the electrodes, and one electrode of the electrostatic lens being placed on the fixing portion.

8. The optical system according to claim 1, wherein the slit is configured such that the part of the second member is connected, through a pair of cross-linking portions arranged at a center of the second member, to the fixing portion.

9. The optical system according to claim 1, wherein both ends in a predetermined direction of the second member are fixed through each of a respective fixing portion to the first member, one of the fixing portions having a smaller coefficient of elasticity in the predetermined direction than that of the other of the fixing portion.

10. A charged particle scribing apparatus comprising:
an optical system of a charged particle according to claim 1; and
a blanker array for deflecting a plurality of the charged particle beams according to a scribing pattern, wherein the first member is a stop aperture array having an aperture for blocking the charged particle beam deflected by the blanker array, and for passing there-through at least a part of the charged particle beam non-deflected by the blanker array.

11. The optical system according to claim 6, wherein each of the first electrode and the second electrode has a plurality of slim combtooth electrodes.

12. An optical system for a charged particle, the optical system comprising:
a first member through which a charged particle beam is transmitted; and
a second member configured to control optically the charged particle beam transmitted through the first member, wherein the second member has a fixing portion fixed to the first member, and the fixing portion is placed so as to interfere with transmission of a deforming stress from the first member to a part of the second member, such that the part of the second member is a cantilever beam structure pivotal in relation to the fixing portion.

* * * * *